(12) United States Patent
Helfan et al.

(10) Patent No.: US 9,741,886 B2
(45) Date of Patent: Aug. 22, 2017

(54) THIN FILM SOLAR COLLECTOR AND METHOD

(71) Applicants: Ron Helfan, Ramat Hasharon (IL); Slava Hasin, Petach Tikva (IL)

(72) Inventors: Ron Helfan, Ramat Hasharon (IL); Slava Hasin, Petach Tikva (IL)

( * ) Notice: Subject to any disclaimer, the term of this patent is extended or adjusted under 35 U.S.C. 154(b) by 539 days.

(21) Appl. No.: 13/749,002

(22) Filed: Jan. 24, 2013

(65) Prior Publication Data

US 2014/0202520 A1    Jul. 24, 2014

(51) Int. Cl.
  *H01L 31/054* (2014.01)
  *H02S 40/22* (2014.01)
  *H01L 31/052* (2014.01)
  *H02S 10/40* (2014.01)
  *H01L 31/056* (2014.01)

(52) U.S. Cl.
  CPC .......... *H01L 31/052* (2013.01); *H01L 31/056* (2014.12); *H01L 31/0543* (2014.12); *H02S 10/40* (2014.12); *Y02E 10/52* (2013.01)

(58) Field of Classification Search
  CPC ............... H01L 31/052; H01L 31/0522; H01L 31/0524; H01L 31/0525; H01L 31/054; H01L 31/0543; H01L 31/0547; H02S 10/40; Y02E 10/52
  USPC .............................. 136/246, 259; 438/69, 72
  See application file for complete search history.

(56) References Cited

U.S. PATENT DOCUMENTS

| | | | |
|---|---|---|---|
| 4,052,228 A * | 10/1977 | Russell | 136/246 |
| 7,846,759 B2 | 12/2010 | Atwater et al. | |
| 2005/0040374 A1* | 2/2005 | Chittibabu et al. | 252/501.1 |
| 2010/0024868 A1* | 2/2010 | Baruchi et al. | 136/246 |
| 2011/0232729 A1* | 9/2011 | Hosoya | H01L 31/048 136/252 |

OTHER PUBLICATIONS

Green et al., Solar cell efficiency tables, Progress in photovoltaic research and applications, 2008, vol. 16, p. 435-440.*
Liu et al., A concentrator module of spherical Si solar cell, Solar Energy Materials & Solar Cells, vol. 91, 2007, p. 1805-1810.*
Kurtz, "CPV 101: Intro to CPV Technology: Opportunities and Challenges", NREL/PR-520-46924, Oct. 26, 2009.

* cited by examiner

*Primary Examiner* — Matthew Martin
*Assistant Examiner* — Dujuan Horton
(74) *Attorney, Agent, or Firm* — Haim M. Factor; 1st-Tech-Ideas

(57) ABSTRACT

A flexible, CPV array having high incident light conversion efficiency, the CPV array comprising: a reflective surface; a plurality of photovoltaic cells configurable to collect radiation from the reflective surface; a concentrating lens (optics) configurable to concentrate the incident light onto the reflective surface and onto the plurality of photovoltaic cells; and a conductor adapted to conduct electricity and heat from the plurality of photovoltaic cells, wherein the CPV array is exposed to incident solar radiation to generate electricity without an incident solar tracking mechanism.

13 Claims, 6 Drawing Sheets

THIN FILM SOLAR COLLECTOR AND METHOD

This application claims priority from U.S. Provisional Application No. 61/590,345, filed 25 Jan. 2012, whose disclosure is incorporated herein by reference.

FIELD AND BACKGROUND OF THE INVENTION

Embodiments of the current invention are related to solar cells and solar panels. More specifically, embodiments of the current invention relate to a thin film solar collector and method.

In the past few decades more and more effort has been directed to develop solar panels, using photovoltaic (PV) devices, which can optimize and maximize energy collection from existing available surfaces, whether they are stationary or mobile. Examples of available surfaces are, inter alia: vehicle or aircraft external surfaces and facets of building structures (otherwise known as building-integrated PV).

The harvesting potential of PV devices is determined by two main attributes:
conversion efficiency—expressed as the portion of the incident/incoming light converted into electric current; and
optical acceptance—the ability of the device to capture incoming light without the incoming light being reflected or scattered from the surface of the device.

In general, the two attributes noted hereinabove determine the generation or harvesting potential for a defined group of devices. Generally, the conversion efficiency of photovoltaic semiconductor devices varies from material to material. Currently there are 3 dominant types of PV cells:
Thin films—having lower conversion efficiencies but high optical acceptance
Crystalline Silicon—most commonly used, having moderate efficiency and moderate optical acceptance; and
Multi junction concentrator cells—having the highest efficiency, low optical acceptance, and usually utilizing concentrating optics. Due to their low optical acceptance, multi junction concentrator cells utilize the direct component of incident solar irradiation, Direct Normal Irradiance (DNI), as known in the art. Solar tracking mechanisms are used to maintain alignment of the cell with incident DNI. These concentrator cells are conventionally referred to as "concentrated photovoltaics" (CPV).

Prior art, applications, and companies producing thin films for PV applications include:
Flexible "Power Plastic", as noted in the Konkara Brochure, and other brochures available at http://www.konarka.com/index.php/company/tech-sheets-and-brochures/, whose disclosure is incorporated herein by reference, by Konarka Technologies, Inc., 116 John Street, Lowell, Mass. 01852, USA;
Thin film applications by AltaDevices Inc, 545 Oakmead Parkway, Sunnyvale, Calif. 94085, USA, as described on http://www.altadevices.com/technology-overview.php;
U.S. Pat. No. 7,846,759 to Atwater et al., entitled "Multi-junction solar cells and methods of making same using layer transfer and bonding techniques", whose disclosure is incorporated herein by reference;
Integrated wide angle light collection solar cells, as described in PV-Magazine, October 2012, whose disclosure is incorporated herein by reference, produced by Solar3D, Inc., 6500, Hollister Ave. Suite 130, Santa Barbara, Calif. 93117, USA.

Kurtz, in a publication entitled: "CPV 101: Intro to CPV Technology: Opportunities and Challenges", NREL/PR-520-46924, 26 Oct. 2009, whose disclosure is incorporated herein by reference, discusses a number of developments related to CPV. Reference is presently made to FIG. 1, prior art—from Kurtz, above, which is a timeline graph showing the development of solar cells over time versus their respective energy conversion efficiencies. It can be seen that from the 1990's through today, multi junction CPV cells appear to have the highest energy efficiencies compared to alternate technologies.

For terrestrial applications, high solar irradiation levels are achieved by light being concentrated onto CPV cells using optics assemblies (also referred herein below in the specification and claims as "optics"). Currently-available MJ cells with optics assemblies operate optimally at irradiation concentration levels of 500-1,000 suns, where a "sun" is defined as 1,000 W\m$^2$. Such optic assemblies have two characteristics:
a. Focal length considerations, yielding CPV panels/modules having significant depth (the focal length being commonly approximately equal to the diagonal of the collective primary lens or mirror);
b. Tracking systems and/or mechanisms—to maintain optimal optical collection of the entire system, system optics, and panels substantially normal to the sun. Dual and single axis tracking mechanisms, as known in the art, are used to achieve this.

Both of the characteristics noted hereinabove significantly increase the cost and complexity of CPV solutions. There is therefore a need for CPV assemblies having a low depth panel/thin profile while exhibiting high conversion efficiency and a reduction/elimination of complicated and costly tracking systems.

SUMMARY OF THE INVENTION

According to the teachings of the present invention there is provided a flexible, CPV array having high incident light conversion efficiency, the CPV array comprising: a reflective surface; a plurality of photovoltaic cells configurable to collect radiation from the reflective surface; a concentrating lens (optics) configurable to concentrate the incident light onto the reflective surface and onto the plurality of photovoltaic cells; and a conductor adapted to conduct electricity and heat from the plurality of photovoltaic cells, wherein the CPV array is exposed to incident solar radiation to generate electricity without an incident solar tracking mechanism. Preferably, the optics is fabricated from at least one radiation transmitting material chosen from the list including: PMMA, polymer, and silicon. Most preferably the photovoltaic cells are chosen from at least one in the list including: multi-junction and single-junction photovoltaic cells. Typically, the plurality of photovoltaic cells has at least one configuration chosen from the list including: bi-facial configuration; and spherical shape. Most typically, the CPV array is scalable and has a substantially linear array alignment.

Preferably, a tubular optic sleeve is configurable coaxially around the scalable CPV array, the tubular optic sleeve being fabricated from at least one light-transmitting material chosen from the list including PMMA and silicone. Most preferably, the tubular optic sleeve has an exterior tubular surface and an internal tubular surface. Typically, the internal tubular surface is the reflective surface. Most typically, the tubular optic sleeve is adapted to concentrate incident solar radiation onto the internal tubular surface and onto the at least one photovoltaic cell. Preferably, the tubular optic sleeve is configured to utilize TIR. Most preferably, the array is scalable to a solar thread CPV device. Typically, a plurality of solar thread CPV devices is wovenable to produce a solar sheet and a garment.

According to the teachings of the present invention there is further provided a method of producing a thin profile, flexible, CPV array having high incident light conversion efficiency, comprising the steps of: taking a reflective surface; configuring a plurality of photovoltaic cells to collect radiation from the reflective surface; configuring a concentrating lens (optics) to concentrate the incident light onto the reflective surface and onto the plurality of photovoltaic cells; and adapting a conductor to conduct electricity and heat from the plurality of photovoltaic cells, whereby the CPV array is exposed to incident solar radiation to generate electricity without an incident solar tracking mechanism. Preferably, the CPV array is scalable. Most preferably, the CPV array has a substantially linear array alignment.

BRIEF DESCRIPTION OF THE DRAWINGS AND APPENDICES

The invention is herein described, by way of example only, with reference to the accompanying drawings, wherein.

DETAILED DESCRIPTION OF THE PREFERRED EMBODIMENTS

One embodiment of the current invention is a low-depth panel/thin profile solar array employing high efficiency cells, while reducing or eliminating expensive and complicated tracking systems/requirements. A reduced panel depth is achieved by using panel surface application using lamination, as described hereinbelow. In one embodiment, aircraft fuselage or other vehicle surfaces are laminated.

Other requirements are for a CPV device to have low mass for the overall collector and to exhibit some mechanical flexibility. Currently-used flexible, thin films, utilizing lamination techniques known in the art, exhibit peak energy conversion efficiency values ranging from approximately 12% to 23%. An objective of an embodiment of the current invention is to have a thin film CPV device exhibiting a photovoltaic efficiency value similar or larger to the values noted hereinabove, while improving the overall performance of the device by collection of a greater portion of the incident irradiation, diffuse and direct.

Choices for the cell configuration/material are, inter alia:
a small concentrator cell, e.g. III-V MJ cell; and
a thin concentrator cell, e.g. GaAs single junction cell Mechanical flexibility is achieved either by having very small rigid areas comprising the cell and the cell substrate or by applying very thin layers of cell materials onto an existing flexible substrate. The optics used for the CPV system are typically made from durable and flexible light-transmitting polymers such as, but not limited to PMMA or from silicone. A CPV solar cell can assume any geometric/3-dimensional shape, such as a spherical shape, to allow absorption of radiation from substantially all directions, thus reducing and/or eliminating requirements for tracking, as described further hereinbelow.

Figure 1:
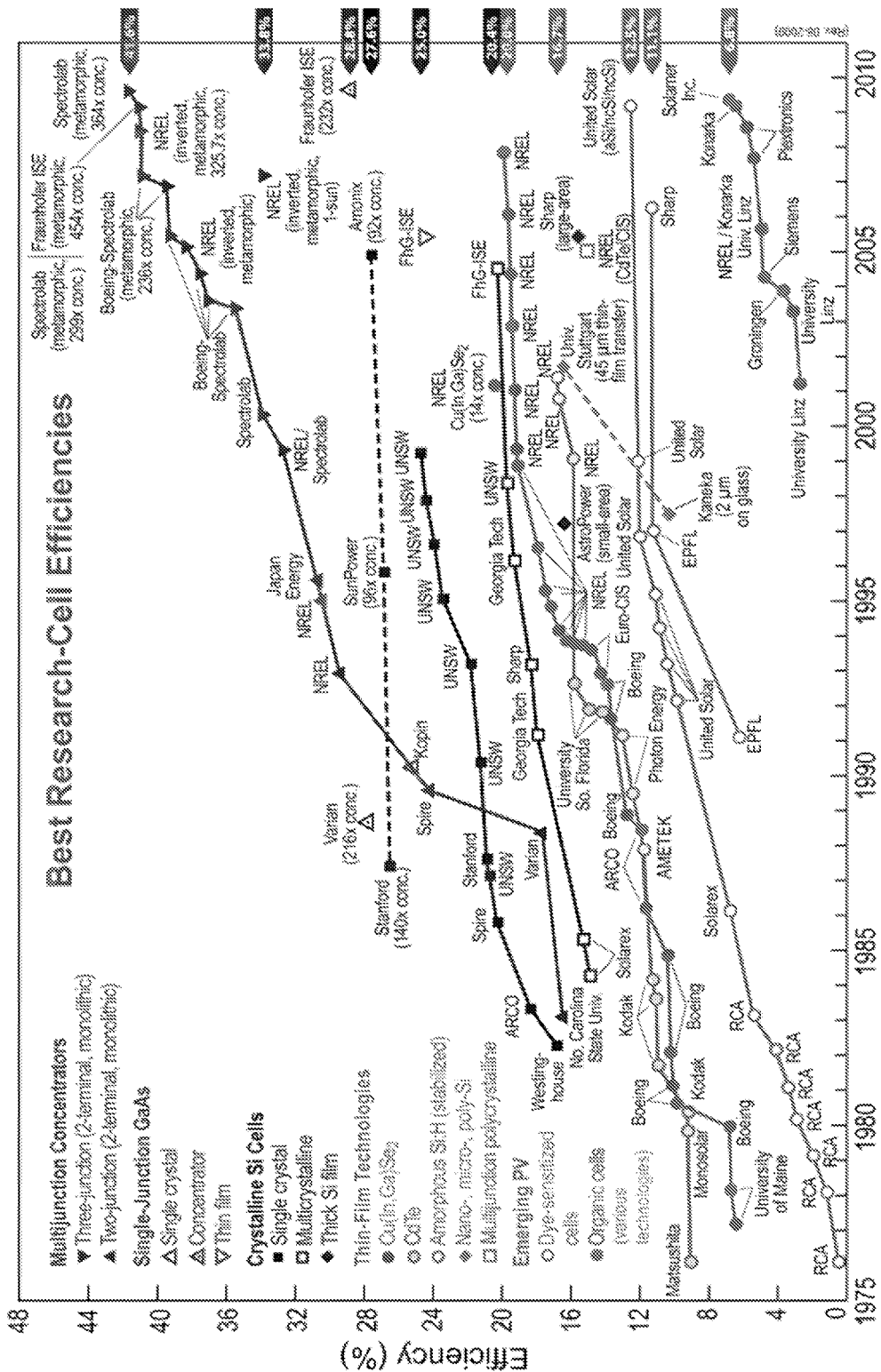
FIG. 1 is a prior art timeline graph showing the development of solar cells over time versus their respective energy conversion efficiencies.
Figure 2:
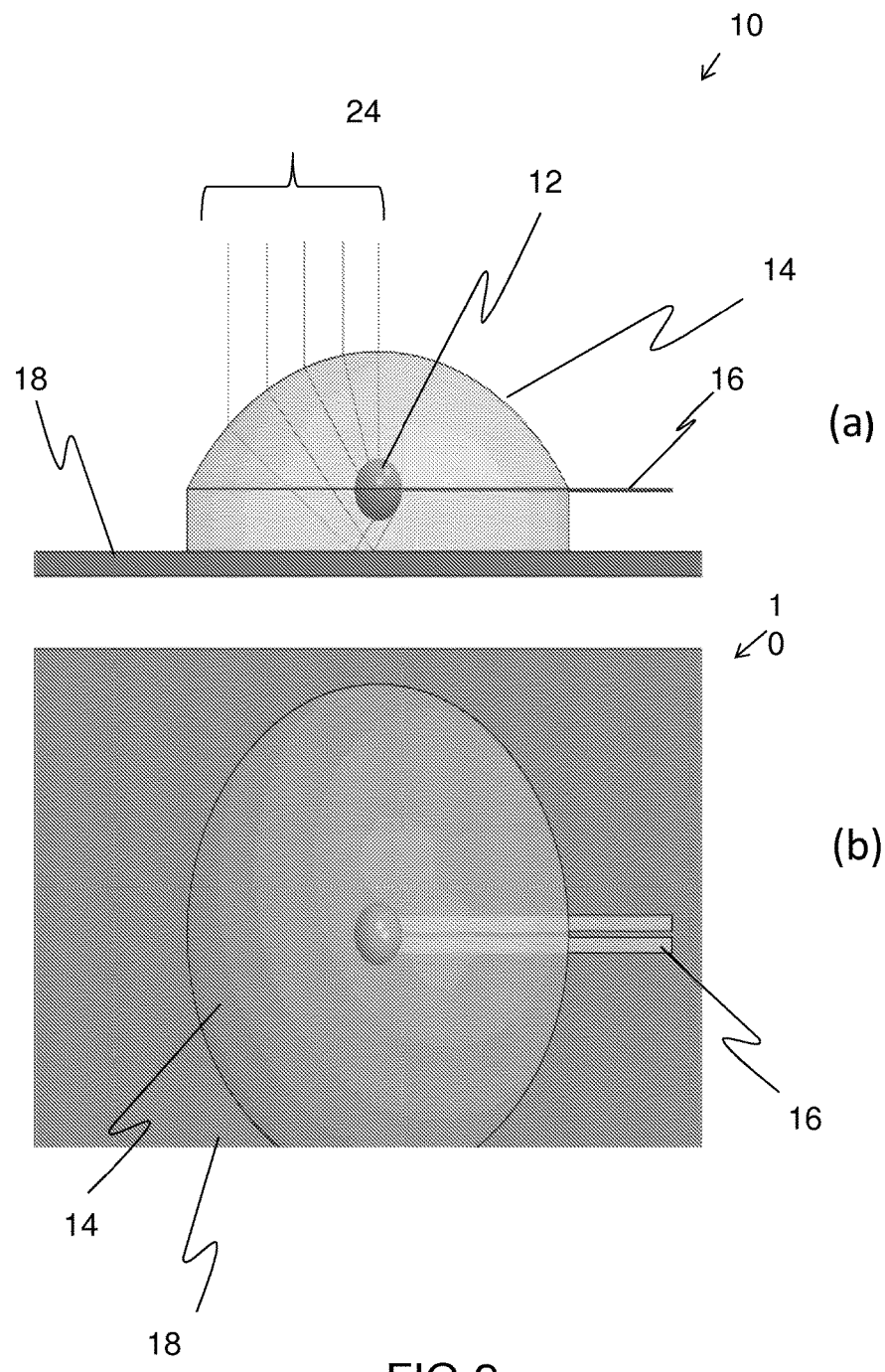
FIG. 2 is a set of orthographic representations of a CPV solar cell device, in accordance with embodiments of the current invention.

Reference is currently made to FIG. 2, which is a set of orthographic representations (elevation "a" and plan "b") of a CPV solar cell device 10, in accordance with embodiments of the current invention. Solar cell device 10 includes a photovoltaic cell (PC) 12; a light concentrating lens 14—referred to hereinbelow as "optics" 14; a thermal and electrical conductor 16—referred to hereinbelow as "conductor" 16; and a reflective surface 18. PC 12 may be fabricated from a single-junction cell or multi-junction cell, as noted hereinabove and as known in the art.

Incident solar radiation 24 is schematically shown in the figure. Optics 14 are preferably fabricated of radiation transmitting polymer material such as, but not limited to PMMA and silicones; and are formed to focus and direct incident solar radiation—from substantially all directions above the reflective surface of the solar device—directly onto PC 12 or to reflect from reflective surface 18 onto the solar cell. An exemplary shape of PC 12 is substantially spherical, which enables light collection from virtually all directions, as described further hereinbelow. Conductor 16 is configured not to substantially impact incident and reflected radiation, as known in the art.

The CPV solar cell device is configured as a modular device, which may be scaled. Scaling allows fabrication of an array of CPV solar cell devices, enabling coverage of larger collection areas—as described further hereinbelow. An embodiment of the current invention includes using the CPV solar cell device to generate electricity without an incident solar tracking mechanism.

Figure 3:
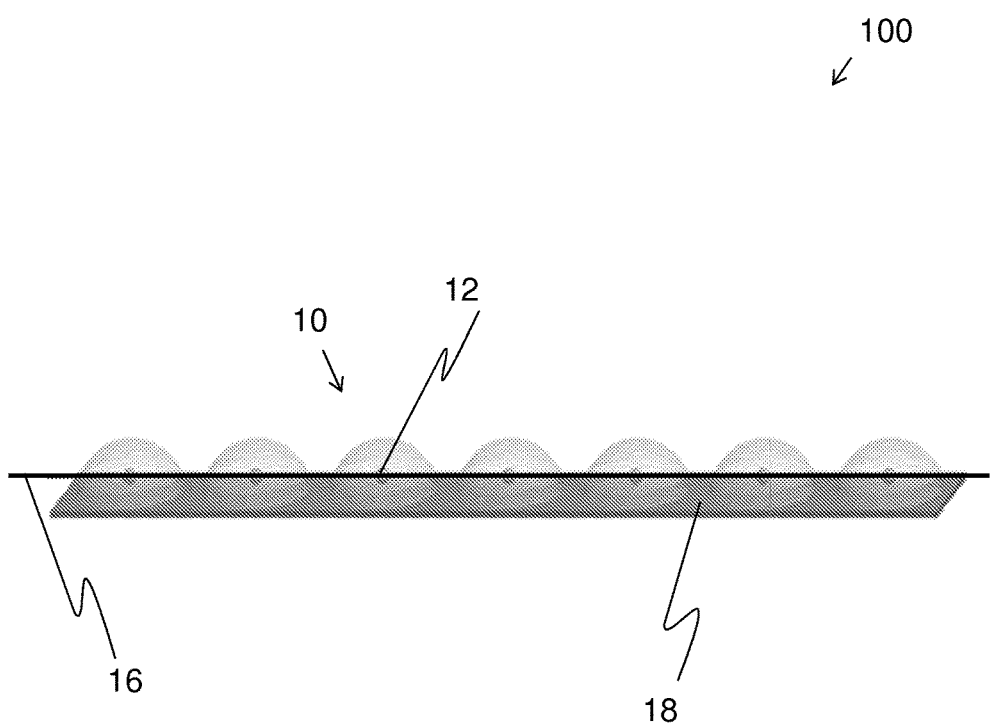
FIG. 3 is a pictorial representation of a solar CPV array, in accordance with embodiments of the current invention.

Reference is currently made to FIG. 3, which is a pictorial representation of a solar CPV array 100, in accordance with embodiments of the current invention. Apart from differences described below, CPV solar cell device 10 is identical in notation, configuration, and functionality to that shown in FIG. 2, and elements indicated by the same reference numerals and/or letters are generally identical in configuration, operation, and functionality as described hereinabove.

Solar CPV array 100 comprises a plurality of CPV solar cell devices 10 aligned in a linear array. Conductor 16 and reflective surface 18 are configured to optimize electrical and thermal characteristics and optical reflective characteristics, respectively, of the solar CPV array. In one embodiment of the current invention solar CPV array 100 is used to generate electricity without the aid of an incident solar tracking mechanism.

Figure 4:
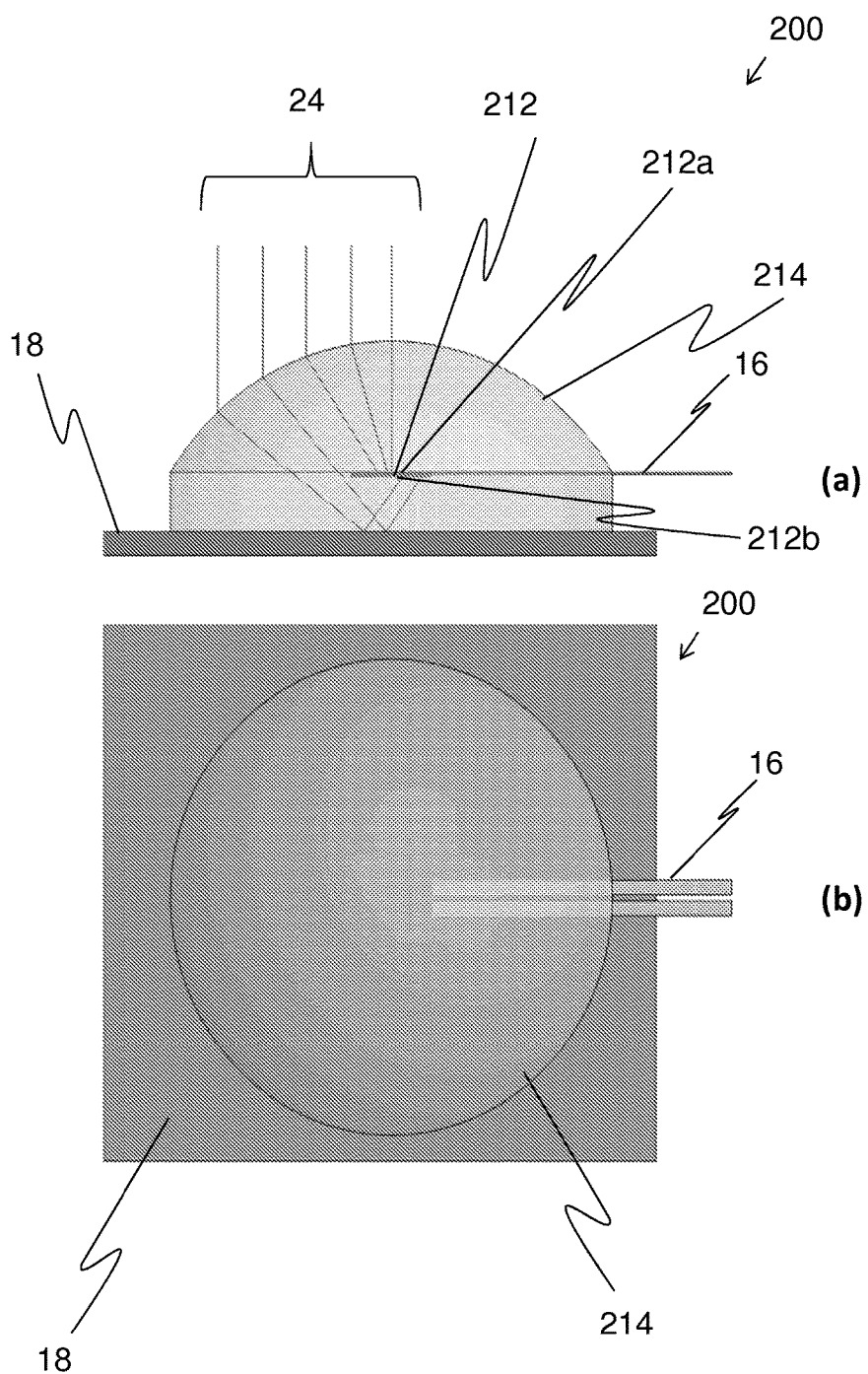
FIG. 4 is a set of orthographic representations of a bifacial CPV device, in accordance with embodiments of the current invention.

Reference is currently made to FIG. 4, which is a set of orthographic representations (elevation "a" and plan "b") of a bifacial CPV device 200, which is generally similar to a CPV solar cell device 10 as shown in FIG. 2, in accordance with embodiments of the current invention. Apart from differences described below, bifacial CPV device 200 is identical in notation, configuration, and functionality to that shown for CPV solar cell device in FIG. 2, and elements indicated by the same reference numerals and/or letters are generally identical in configuration, operation, and functionality as described hereinabove. In the present figure, photovoltaic cell 212 is configured, along with a nearly spherical shape of optics 214 to absorb incident radiation 24 in an alternate configuration to than shown in FIG. 2. The alternate configuration may be less-optimized in terms of directionality of bifacial CPV device 200 with regard to incident radiation 24; however more than one bifacial CPV device 200 may be more generally scaled and applied in an array of configurations to increase overall area exposure to incident radiation, as described hereinbelow. PV cell 212 has an exemplary bifacial configuration, enabling collection of radiation from a top facet 212a and a bottom facet 212b of the PV cell. Typically, top facet 212a absorbs radiation directly transmitted from the optics, whereas bottom facet 212b absorbs radiation reflected from reflective surface 18.

In an embodiment of the current invention solar thread CPV device 200 is used to generate electricity without the aid of an incident solar tracking mechanism.

Figure 5:
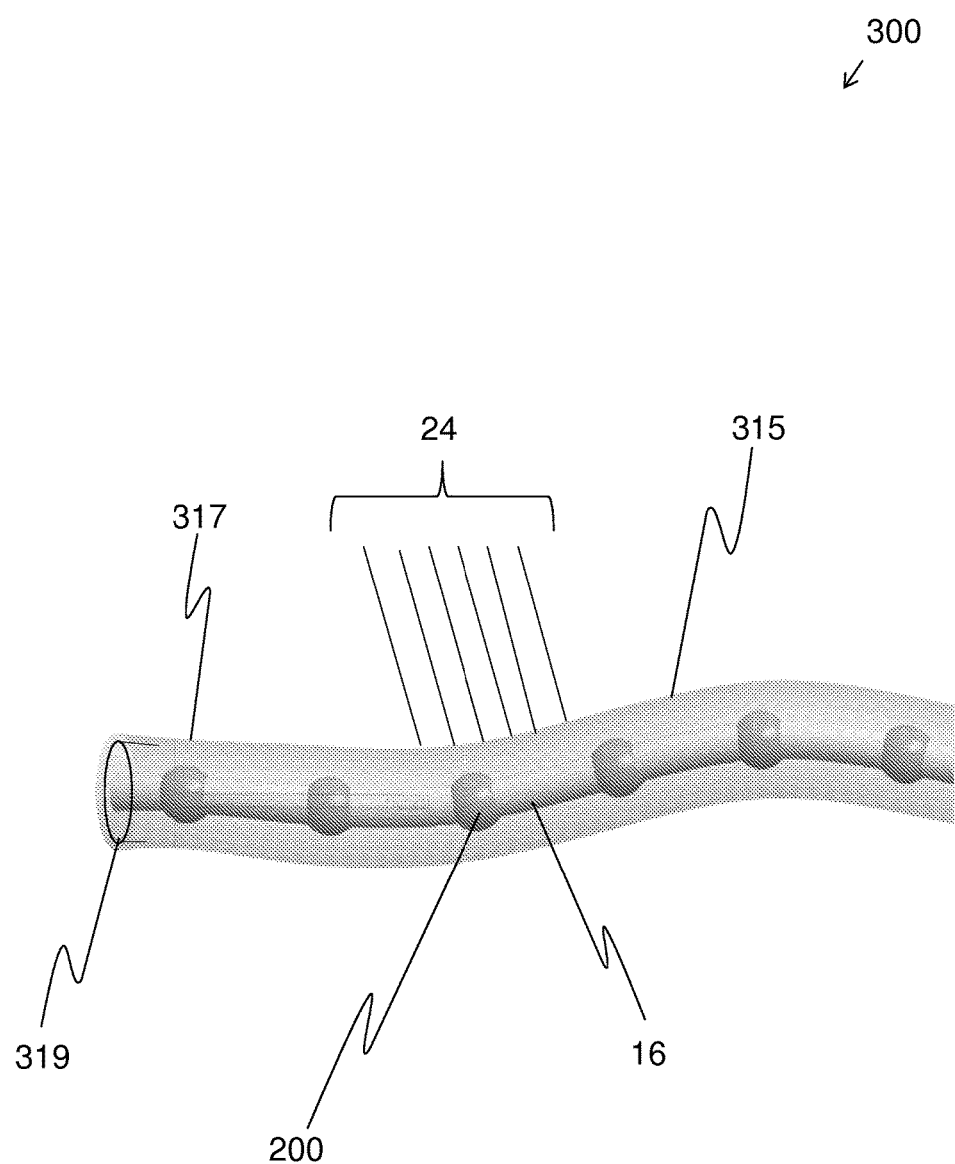
FIG. 5 is a pictorial representation of a solar thread CPV device, in accordance with embodiments of the current invention.

Reference is currently made to FIG. 5, which is a pictorial representation of a solar thread CPV device 300, in accordance with embodiments of the current invention. Apart from differences described below, bifacial CPV device 200 is identical in notation, configuration, and functionality to that shown in FIG. 4, and elements indicated by the same reference numerals and/or letters are generally identical in configuration, operation, and functionality as described hereinabove. Solar thread CPV device 300 includes a generally linear and flexible array of a plurality of spherical CPV devices 200, which are interconnected by conductor 16, as shown in the figure. Alternatively or optionally, solar thread CPV device 300 includes a generally linear and flexible array of a plurality of CPV arrays 100, which are interconnected by conductor 16. A tubular optical sleeve 315 is configured generally along the length of solar thread CPV device 300, coaxially around the array of the plurality of bifacial CPV devices 200, or CPV arrays 100, mutatis mutandis, and acts as a concentrating prism or lens, as described hereinbelow. Optical sleeve 315 is fabricated from a light-transmitting polymer such as PMMA or from a silicone. Optical sleeve 315 has an exterior tubular surface 317 and an internal tubular surface 319, indicated schematically in the figure. Internal tubular surface 319 serves to reflect solar radiation to the photovoltaic cell as indicated for reflective surface 16 indicated in FIGS. 2 and 4 and as further described hereinbelow.

The elongated tubular shape of optical sleeve 315 allows incident solar radiation 24 to be transmitted through the exterior and interior tubular surfaces of the sleeve and to be directed onto the array of the plurality of bifacial CPV devices 200, or CPV arrays 100, mutatis mutandis, configured internally to the internal tubular surface. The incident radiation is mostly not reflected/refracted from the exterior tubular surface of the optical sleeve due to the effect of TIR (Total Internal Reflection), as known in the art. Essentially, incident solar radiation transmitted through and internally to the optical sleeve is reflected within the sleeve, i.e. from internal tubular surface 319, and onto the plurality of bifacial CPV devices 200, or CPV arrays 100, mutatis mutandis. TIR is enhanced by maintaining a curvature of optical sleeve 315 so that incident radiation 24 is reflected within internal tubular surface 319, which acts as the reflective surface, at a critical angle. Additionally or alternatively, TIR may be enhanced by the application of an optical coating or surface finish on exterior tubular surface 317. In an embodiment of the current invention solar thread CPV device 300 generates electricity without the aid of a solar tracking mechanism.

Figure 6:
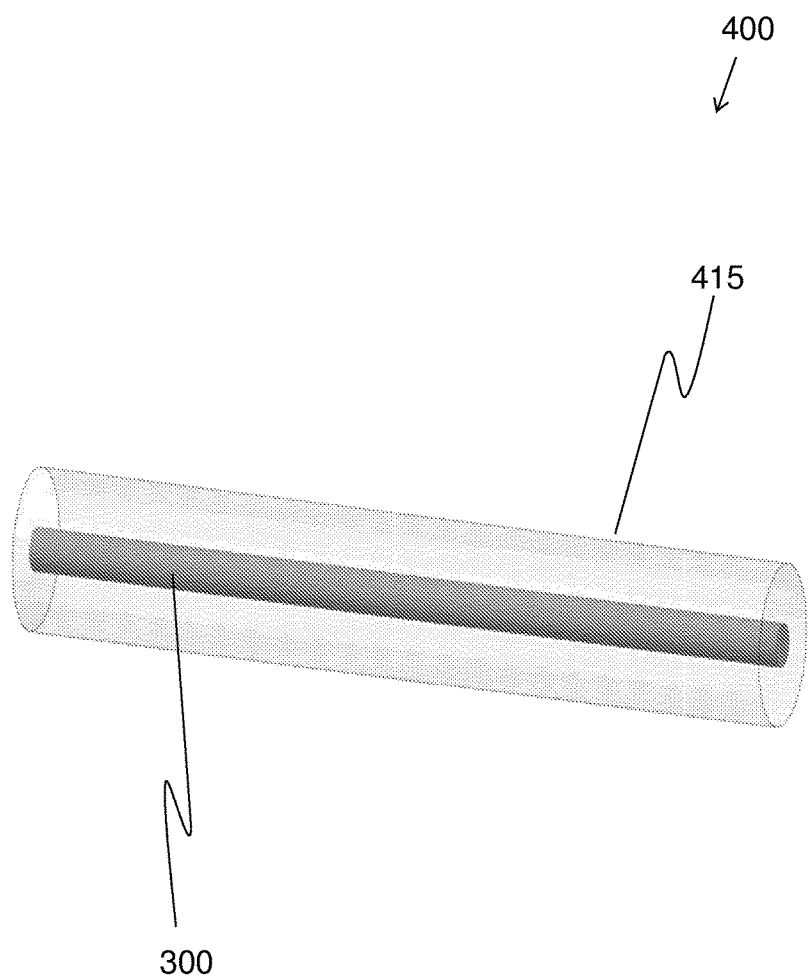
FIG. 6 is a pictorial representation of a solar thread wire CPV device, in accordance with embodiments of the current invention.

Reference is currently made to FIG. 6, which is a pictorial representation of a solar thread integrated CPV device 400, in accordance with embodiments of the current invention. Apart from differences described below, CPV device 300 is identical in notation, configuration, and functionality to that shown in FIG. 5, and elements indicated by the same reference numerals and/or letters are generally identical in configuration, operation, and functionality as described hereinabove.

Solar thread integrated CPV device 400 comprises conductor 16, which is coated with a plurality of CPV cells, similar to CPV device 200 of FIG. 5, so that the solar thread device comprises an integrated, substantially continuous cell device. An elongated optical tube 415 acts as the concentrating optics, similar to optical sleeve 315 of FIG. 5. Elongated tube 415 is likewise formed of a flexible, light transmitting polymer or of silicone. Solar thread integrated CPV device 400 generates electricity without the aid of a solar tracking mechanism.

Optionally or alternatively, a plurality of solar thread integrated CPV devices 400 may be woven together to produce a solar sheet or garment (not shown in the figures).

It may be seen from the description hereinabove of FIGS. 2-6 that the solar thread CPV device may be manufactured by configuring a linear and flexible array of a plurality of spherical CPV devices 200 and then scaling the array to the desired solar thread CPV size.

Fabrication of the devices described hereinabove utilizes electronic and semiconductor device fabrication methods, as known in the art.

It will be appreciated that the above descriptions are intended only to serve as examples, and that many other embodiments are possible within the scope of the present invention as defined in the appended claims.

The invention claimed is:

1. A flexible, CPV array having an incident light conversion efficiency ranging from 12% to 23% or larger, the CPV array comprising:
   a substantially flat reflective surface;
   a plurality of photovoltaic single-junction or multi-junction cells, each of the plurality of cells having a substantial semispherical shape, and configured to collect radiation from substantially all directions and from the reflective surface;
   a concentrating lens having a semispherical shape, the lens configurable to concentrate incident light onto the reflective surface and directly onto the plurality of photovoltaic cells;
   a conductor configured to conduct electricity and heat from the plurality of photovoltaic cells; and
   a tubular optic sleeve configured coaxially around the CPV array, the tubular optic sleeve being fabricated from at least one light-transmitting material chosen from the list consisting of PMMA and silicone,
   wherein the CPV array is exposed to incident solar radiation to generate electricity without an incident solar tracking mechanism.

2. The array of claim 1, wherein the concentrating lens is fabricated from at least one radiation transmitting material chosen from the list including: PMMA, polymer, and silicon.

3. The array of claim 2, wherein the plurality of photovoltaic cells have at least one configuration chosen from the list including: bi-facial configuration; and spherical shape.

4. The array of claim 2, wherein the CPV array is scalable and has a substantially linear array alignment.

5. The array of claim 1, wherein the tubular optic sleeve has an exterior tubular surface and an internal tubular surface.

6. The array of claim 5, wherein the internal tubular surface is the reflective surface.

7. The array of claim 6, wherein the tubular optic sleeve is adapted to concentrate incident solar radiation onto the internal tubular surface and onto the plurality of photovoltaic cells.

8. The array of claim 7, wherein the tubular optic sleeve is configured to utilize TIR.

9. The array of claim 8, wherein the array is scalable to a solar thread CPV device.

10. The array of claim 9, wherein a plurality of solar thread CPV devices is configured to be woven to produce a solar sheet and a garment.

11. A method of producing a thin profile, flexible, CPV array having an incident light conversion efficiency ranging from 12% to 23% or larger, comprising the steps of:
  configuring a plurality of photovoltaic single-junction or multi-junction cells, each of the plurality of cells having a substantial semispherical shape to collect radiation from substantially all directions and from a substantially flat reflective surface;
  configuring a concentrating lens having a semispherical shape to concentrate incident light onto the reflective surface and directly onto the plurality of photovoltaic cells;
  configuring a conductor to conduct electricity and heat from the plurality of photovoltaic cells; and
  configuring a tubular optic sleeve coaxially around the CPV array, the tubular optic sleeve being fabricated from at least one light-transmitting material chosen from the list of PMMA, and silicone,
whereby the CPV array is exposed to incident solar radiation to generate electricity without an incident solar tracking mechanism.

12. The method of claim 11, whereby the CPV array is scalable.

13. The method of claim 11, whereby the CPV array has a substantially linear array alignment.

* * * * *